(12) United States Patent
Swift et al.

(10) Patent No.: US 7,592,224 B2
(45) Date of Patent: Sep. 22, 2009

(54) METHOD OF FABRICATING A STORAGE DEVICE INCLUDING DECONTINUOUS STORAGE ELEMENTS WITHIN AND BETWEEN TRENCHES

(75) Inventors: Craig T. Swift, Austin, TX (US); Gowrishankar L. Chindalore, Austin, TX (US); Paul A. Ingersoll, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 396 days.

(21) Appl. No.: 11/393,287

(22) Filed: Mar. 30, 2006

(65) Prior Publication Data

US 2007/0238249 A1    Oct. 11, 2007

(51) Int. Cl.
*H01L 21/336* (2006.01)

(52) U.S. Cl. .................. 438/259; 438/260; 438/264; 438/266; 257/E21.676

(58) Field of Classification Search ............... 438/266, 438/259, 257, 260, 264; 257/E21.676
See application file for complete search history.

(56) References Cited

U.S. PATENT DOCUMENTS

| | | |
|---|---|---|
| 4,184,207 A | 1/1980 | McElroy et al. |
| 4,751,558 A | 6/1988 | Kenney |
| 4,785,337 A | 11/1988 | Kenney |
| 4,833,094 A | 5/1989 | Kenney |
| 4,860,070 A | 8/1989 | Arimoto et al. |
| 5,196,722 A | 3/1993 | Bergendahl et al. |
| 5,252,845 A | 10/1993 | Kim et al. |
| 5,315,142 A | 5/1994 | Acovic et al. |
| 5,411,905 A | 5/1995 | Acovic et al. |
| 5,432,365 A | 7/1995 | Chin et al. |
| 5,460,988 A | 10/1995 | Hong |
| 5,567,635 A | 10/1996 | Acovic et al. |
| 5,705,415 A | 1/1998 | Orlowski et al. |
| 5,721,448 A | 2/1998 | Hauf et al. |
| 5,786,612 A | 7/1998 | Otani et al. |
| 5,801,415 A | 9/1998 | Lee et al. |
| 5,824,580 A | 10/1998 | Hauf et al. |

(Continued)

FOREIGN PATENT DOCUMENTS

WO    2007114984 A3    10/2007

OTHER PUBLICATIONS

International Search Report issued Nov. 23, 2007 for related PCT application, PCT/US07/62794, 2 pages.

(Continued)

*Primary Examiner*—Michael Trinh

(57) ABSTRACT

A semiconductor storage cell includes a first source/drain region underlying a first trench defined in a semiconductor layer. A second source/drain region underlies a second trench in the semiconductor layer. A first select gate in the first trench and a second select gate in the second trench are lined by a select gate dielectric. A charge storage stack overlies the select gates and a control gate overlies the stack. The DSEs may comprise discreet accumulations of polysilicon. An upper surface of the first and second select gates is lower than an upper surface of the first and second trenches. The control gate may be a continuous control gate traversing and running perpendicular to the select gates. The cell may include contacts to the semiconductor layer. The control gate may include a first control gate overlying the first select gate and a second control gate overlying the second select gate.

20 Claims, 9 Drawing Sheets

U.S. PATENT DOCUMENTS

| | | | |
|---|---|---|---|
| 5,907,775 | A | 5/1999 | Tseng |
| 5,914,523 | A | 6/1999 | Bashir et al. |
| 5,923,046 | A | 7/1999 | Tezuka et al. |
| 5,969,383 | A | 10/1999 | Chang et al. |
| 5,998,263 | A | 12/1999 | Sekariapuram et al. |
| 6,060,743 | A * | 5/2000 | Sugiyama et al. ............ 257/321 |
| 6,074,954 | A | 6/2000 | Lill et al. |
| 6,117,733 | A | 9/2000 | Sung et al. |
| 6,121,148 | A | 9/2000 | Bashir et al. |
| 6,133,601 | A | 10/2000 | Watanabe |
| 6,172,905 | B1 | 1/2001 | White et al. |
| 6,228,706 | B1 | 5/2001 | Horak et al. |
| 6,232,632 | B1 * | 5/2001 | Liu .............................. 257/315 |
| 6,265,268 | B1 | 7/2001 | Halliyal et al. |
| 6,281,064 | B1 | 8/2001 | Mandelman et al. |
| 6,287,917 | B1 | 9/2001 | Park et al. |
| 6,307,782 | B1 | 10/2001 | Sadd et al. |
| 6,320,784 | B1 | 11/2001 | Muralidhar et al. |
| 6,330,184 | B1 | 12/2001 | White et al. |
| 6,344,403 | B1 | 2/2002 | Madhukar et al. |
| 6,365,452 | B1 | 4/2002 | Perng et al. |
| 6,368,916 | B1 | 4/2002 | Nakagawa |
| 6,372,617 | B1 | 4/2002 | Kitamura |
| 6,373,096 | B1 | 4/2002 | Hisamune et al. |
| 6,399,441 | B1 | 6/2002 | Ogura et al. |
| 6,461,905 | B1 | 10/2002 | Wang et al. |
| 6,486,028 | B1 | 11/2002 | Chang et al. |
| 6,537,870 | B1 | 3/2003 | Shen |
| 6,544,827 | B2 | 4/2003 | Abiko |
| 6,555,427 | B1 | 4/2003 | Shimizu et al. |
| 6,559,032 | B2 | 5/2003 | Gonzalez et al. |
| 6,583,466 | B2 | 6/2003 | Lin et al. |
| 6,605,839 | B2 | 8/2003 | Miura et al. |
| 6,620,664 | B2 | 9/2003 | Ma et al. |
| 6,638,810 | B2 | 10/2003 | Bakli et al. |
| 6,673,681 | B2 | 1/2004 | Kocon et al. |
| 6,674,120 | B2 | 1/2004 | Fujiwara |
| 6,677,204 | B2 | 1/2004 | Cleeves et al. |
| 6,687,156 | B2 | 2/2004 | Kobayashi et al. |
| 6,706,599 | B1 | 3/2004 | Sadd et al. |
| 6,709,922 | B2 | 3/2004 | Ebina et al. |
| 6,713,834 | B2 | 3/2004 | Mori et al. |
| 6,734,492 | B2 | 5/2004 | Yamazaki et al. |
| 6,747,308 | B2 | 6/2004 | Mitros et al. |
| 6,750,499 | B2 | 6/2004 | Wu |
| 6,762,092 | B2 | 7/2004 | Yuan et al. |
| 6,803,620 | B2 | 10/2004 | Moriya et al. |
| 6,816,414 | B1 | 11/2004 | Prinz |
| 6,818,508 | B2 | 11/2004 | Shimizu et al. |
| 6,818,512 | B1 | 11/2004 | Hsieh et al. |
| 6,818,939 | B1 | 11/2004 | Hadizad |
| 6,852,597 | B2 | 2/2005 | Park et al. |
| 6,853,587 | B2 | 2/2005 | Forbes |
| 6,861,315 | B1 | 3/2005 | Chen et al. |
| 6,864,540 | B1 | 3/2005 | Divakaruni et al. |
| 6,881,994 | B2 | 4/2005 | Lee et al. |
| 6,894,339 | B2 | 5/2005 | Fan et al. |
| 6,903,418 | B2 | 6/2005 | Iwamoto et al. |
| 6,916,715 | B2 | 7/2005 | Hsiao et al. |
| 6,936,887 | B2 | 8/2005 | Harari et al. |
| 6,952,034 | B2 | 10/2005 | Hu et al. |
| 6,958,513 | B2 | 10/2005 | Wang et al. |
| 6,998,313 | B2 | 2/2006 | Lin |
| 7,015,537 | B2 | 3/2006 | Lee et al. |
| 7,045,423 | B2 | 5/2006 | Ichige et al. |
| 7,078,286 | B1 | 7/2006 | Mehta |
| 7,098,502 | B2 | 8/2006 | Mathew et al. |
| 7,112,490 | B1 | 9/2006 | Hong et al. |
| 7,122,432 | B2 | 10/2006 | Shimizu et al. |
| 7,192,830 | B2 | 3/2007 | Goldbach et al. |
| 7,196,935 | B2 | 3/2007 | Forbes |
| 7,199,419 | B2 | 4/2007 | Haller |
| 7,205,608 | B2 | 4/2007 | Chindalore et al. |
| 7,211,487 | B2 | 5/2007 | Chindalore et al. |
| 7,211,858 | B2 | 5/2007 | Prinz |
| 7,220,634 | B2 | 5/2007 | Prall et al. |
| 7,226,840 | B2 | 6/2007 | Chindalore et al. |
| 7,238,599 | B2 | 7/2007 | Forbes |
| 7,244,987 | B2 | 7/2007 | Forbes |
| 7,250,340 | B2 | 7/2007 | Swift et al. |
| 7,259,984 | B2 | 8/2007 | Kan et al. |
| 7,279,740 | B2 | 10/2007 | Bhattacharyya et al. |
| 7,371,642 | B2 | 5/2008 | Forbes |
| 2005/0146937 | A1 | 7/2005 | Fan et al. |
| 2005/0146938 | A1 | 7/2005 | Forbes |
| 2005/0148173 | A1 | 7/2005 | Shone |
| 2005/0161731 | A1 * | 7/2005 | Ingersoll et al. ............. 257/325 |
| 2005/0242391 | A1 | 11/2005 | She et al. |
| 2005/0275002 | A1 * | 12/2005 | Shone ........................ 257/296 |
| 2005/0280094 | A1 | 12/2005 | Forbes |
| 2006/0011966 | A1 | 1/2006 | Wang |
| 2006/0046383 | A1 | 3/2006 | Chen et al. |
| 2006/0076586 | A1 | 4/2006 | Swift et al. |
| 2006/0076609 | A1 | 4/2006 | Chindalore et al. |
| 2006/0131640 | A1 | 6/2006 | Yu et al. |
| 2006/0166443 | A1 | 7/2006 | Forbes |
| 2007/0018216 | A1 | 1/2007 | Chindalore et al. |
| 2007/0018221 | A1 | 1/2007 | Swift et al. |
| 2007/0018222 | A1 | 1/2007 | Sadd et al. |
| 2007/0018229 | A1 | 1/2007 | Yater et al. |
| 2007/0018232 | A1 | 1/2007 | Chindalore et al. |
| 2007/0018234 | A1 | 1/2007 | Chindalore et al. |
| 2007/0019472 | A1 | 1/2007 | Yater et al. |
| 2007/0020831 | A1 | 1/2007 | Chindalore et al. |
| 2007/0020840 | A1 | 1/2007 | Chindalore |
| 2007/0020851 | A1 | 1/2007 | Hong et al. |
| 2007/0020856 | A1 | 1/2007 | Sadd et al. |
| 2008/0019178 | A1 | 1/2008 | Yater et al. |
| 2008/0173921 | A1 | 7/2008 | Li et al. |
| 2008/0173922 | A1 | 7/2008 | Hong et al. |
| 2008/0173923 | A1 | 7/2008 | Li et al. |

OTHER PUBLICATIONS

Guan, H , et al. "An Analytical Model for Optimization of Programming Efficiency and Uniformity of Split Gate Source-Side Injection Superflash Memory," IEEE Transactions on Electron Devices, vol. 50, No. 3, pp. 809-815, Mar. 2003.

Hayashi, Y., et al. "Twin MONOS Cell with Dual Control Gates," 2000 Symposium on VLSI Technology Digest of Technical Papers, pp. 122-123, 2000.

Lee, D., et al. "Vertical Floating-Gate 4.5F2 Split-Gate NOR Flash Memory at 110nm Node," 2004 Symposium on VLSI Technology Digest of Technical Papers, pp. 72-73, 2004.

Ma, Y. et al. "A Dual-Bit Split-Gate EEPROM (DSG) Cell in Contactless Array for Single-Vcc High Density Flash Memories," IEDM, p. 57-60, 1994.

Osabe, T. et al. "Charge-Injection Length in Silicon Nanocrystal Memory Cells," 2004 Symposium on VLSI Technology Digest of Technical Papers p. 242-243, 2004.

Van Houdt, J., et al. "An Analytical Model for the Optimization of Source-Side Injection Flash EEPROM Devices," IEEE Transactions on Electron Devices, vol. 42, No. 7, pp. 1314-1320, Jul. 1995.

Yang, Edward S., "8-3 Channel Conductance", Fundamentals of Semiconductor Devices, McGraw-Hill Book Company, p. 205, 1978.

Written Opinion of the International Searching Authority for International Publication No. 2007114984 dated Nov. 23, 2007, 4 pgs.

A list of Actions on the Merits by U S P.T. O, as of Feb. 17, 2009, 14 pgs.

* cited by examiner

SSI PROGRAM/ERASE TABLE (FOR DEVICE OF FIG. 11)

| OPERATION | CG 160 | SG 130-1 | SG 130-2 | S/D 112-1 | S/D 112-2 | WELL 102 |
|---|---|---|---|---|---|---|
| INJECTION REGION 170-1 | $V_{P3}$ | $V_{P3}$ | $V_{P2}$ | $V_{P1}$ | $V_{P4}$ | $V_{P4}$ |
| INJECTION REGION 170-2 | $V_{P3}$ | $V_{P2}$ | $V_{P3}$ | $V_{P4}$ | $V_{P1}$ | $V_{P4}$ |
| ERASE | $V_{E1}$ | $V_{E1}$ | X | X | X | $V_{E2}$ |
| | | | | | | |

$V_{P1}$=5V  $V_{P3}$=6V  $V_{E1}$=-6V  X=NO CONNECT
$V_{P2}$=8V  $V_{P4}$=0V  $V_{E2}$=6V

SSI PROGRAM/ERASE TABLE (FOR DEVICE OF FIG. 16)

| OPERATION | CG 160 | SG 130-1 | SG 130-2 | S/D 112-1 | S/D 112-2 | DIFF 164-1 | DIFF 164-2 | WELL 102 |
|---|---|---|---|---|---|---|---|---|
| PROGRAM BIT 170-1 | $V_{P2}$ | $V_{P3}$ | X | $V_{P1}$ | X | $V_{P4}$ | X | $V_{P4}$ |
| PROGRAM BIT 170-2 | $V_{P2}$ | X | $V_{P3}$ | X | $V_{P1}$ | $V_{P4}$ | X | $V_{P4}$ |
| PROGRAM BIT 170-3 | $V_{P2}$ | $V_{P3}$ | X | $V_{P1}$ | X | X | $V_{P4}$ | $V_{P4}$ |
| PROGRAM BIT 170-4 | $V_{P2}$ | X | $V_{P3}$ | X | $V_{P1}$ | X | $V_{P4}$ | $V_{P4}$ |
| ERASE BITS 170-1,-2,-3,-4 | $V_{E1}$ | X | X | X | X | X | X | $V_{E2}$ |

$V_{P1}$=5V  $V_{P3}$=6V  $V_{E1}$=-6V  X=NO CONNECT
$V_{P2}$=8V  $V_{P4}$=0V  $V_{E2}$=6V

SSI PROGRAM/ERASE TABLE (FOR DEVICE OF FIG. 14)

| OPERATION | CG 160-1 | CG 160-2 | SG 130-1 | SG 130-2 | S/D 112-1 | S/D 112-2 | DIFF 164 | WELL 102 |
|---|---|---|---|---|---|---|---|---|
| PROGRAM BIT 170-3 | $V_{P2}$ | X | $V_{P3}$ | X | $V_{P1}$ | X | $V_{P4}$ | $V_{P4}$ |
| PROGRAM BIT 170-4 | X | $V_{P2}$ | X | $V_{P3}$ | X | $V_{P1}$ | $V_{P4}$ | $V_{P4}$ |
| ERASE BITS 114-1,-2 | $V_{E1}$ | $V_{E1}$ | X | X | X | X | X | $V_{E2}$ |

$V_{P1}$=5V  $V_{P3}$=6V  $V_{E1}$=-6V  X=NO CONNECT
$V_{P2}$=8V  $V_{P4}$=0V  $V_{E2}$=6V

HCI PROGRAM/ERASE TABLE (FOR DEVICE OF FIG. 14)

| OPERATION | CG 162-1 | CG 162-2 | SG 130-1 | SG 130-2 | S/D 112-1 | S/D 112-2 | DIFF 164 | WELL 102 |
|---|---|---|---|---|---|---|---|---|
| PROGRAM BIT 170-1 | $V_{P6}$ | X | $V_{P7}$ | X | $V_{P5}$ | X | $V_{P4}$ | $V_{P4}$ |
| PROGRAM BIT 170-2 | X | $V_{P6}$ | X | $V_{P7}$ | X | $V_{P5}$ | $V_{P4}$ | $V_{P4}$ |
| ERASE BITS 114-1,-2 | $V_{E1}$ | $V_{E1}$ | X | X | X | X | $V_{E2}$ | $V_{E2}$ |

$V_{P5}$=5V  $V_{P7}$=6V  $V_{E1}$=-6V  X=NO CONNECT
$V_{P6}$=8V  $V_{P4}$=0V  $V_{E2}$=6V

METHOD OF FABRICATING A STORAGE DEVICE INCLUDING DECONTINUOUS STORAGE ELEMENTS WITHIN AND BETWEEN TRENCHES

RELATED APPLICATION

The subject matter of the following applications, including this application, is related: Swift and Chindalore, Programmable Structure Including Discontinuous Storage Elements and Spacer Control Gates in a Trench, Ser. No. 11/188,585, filed Jul. 25, 2005 and Swift and Chindalore, Method of Fabricating Programmable Structure Including Discontinuous Storage Elements and Spacer Control Gates in a Trench, Ser. No. 11/188,584, filed Jul. 25, 2005.

FIELD OF THE INVENTION

The invention is in the field of semiconductor devices and, more particularly, nonvolatile storage devices.

RELATED ART

Nonvolatile storage is an important element in the design of substantially all electronic devices. In the field of wireless and portable electronic devices, nonvolatile storage must be compact and consume little power. Various nonvolatile storage cells have been proposed and implemented. Included among these conventional cells are planar storage cells and storage cells employing floating gates as a charge storage element. A planar storage cell is characterized by a planar transistor channel region typically located in proximity to an upper surface of the wafer substrate. While planar technology is mature and well understood, planar devices consume an undesirably large amount of wafer area.

With respect to the charge storage element, conventional floating gates have been made of a contiguous strip of a conductive material such as polysilicon. Conductive floating gates present a problem in devices with very thin dielectrics. Thin dielectrics are particularly susceptible to pin hole defects. With a conductive floating gate, all of the stored charge on the floating gate can leak off through a single pin hole defect in the dielectric. Moreover, conventional floating gates are not suitable for localized programming in which injected electrons are confined to a specific location of the charge storage element. Localized programming offers the prospect of multiple bit storage cell, where each bit is associated with a specific region of the charge storage element. Accordingly, it would be desirable to implement a multiple bit storage device suitable for use in an advanced processes employing very thin dielectrics where the design of the implemented device consumes less area than planar devices and devices employing conventional charge storage elements.

BRIEF DESCRIPTION OF THE DRAWINGS

The present invention is illustrated by way of example and not limited by the accompanying figures, in which like references indicate similar elements, and in which:

FIG. 18 is a programming table for the injection regions of the storage device of FIG. 11;

FIG. 19 is a programming table for the ballistic injection regions of the storage device of FIG. 14;

FIG. 20 is a programming table for the hot carrier injection regions of the storage device of FIG. 14; and FIG. 21 is a programming table for the hot carrier injection regions of the storage device of FIG. 16.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In one aspect, a semiconductor-based storage cell and a corresponding fabrication process employ a trench etched into a semiconductor layer, a select gate formed in the trench, a charge storage stack formed in the trench overlying the select gate, and a control gate overlying the charge storage stack. The depth of the trench exceeds the height of the select gate so that a gap exists between the top of the trench and the top of the select gate. The charge storage stack preferably includes a set of discontinuous storage elements (DSEs). In this embodiment, the DSEs may be silicon nanocrystals or nanoclusters, which are small, discreet silicon structures embedded in a dielectric layer and capable of holding a positive or negative charge. Because DSEs are not physically or electrically connected to each other, DSEs are less susceptible to charge loss through pin holes in the dielectric layer than conventional storage elements such as conventional polysilicon floating gate structures.

Figure 1:
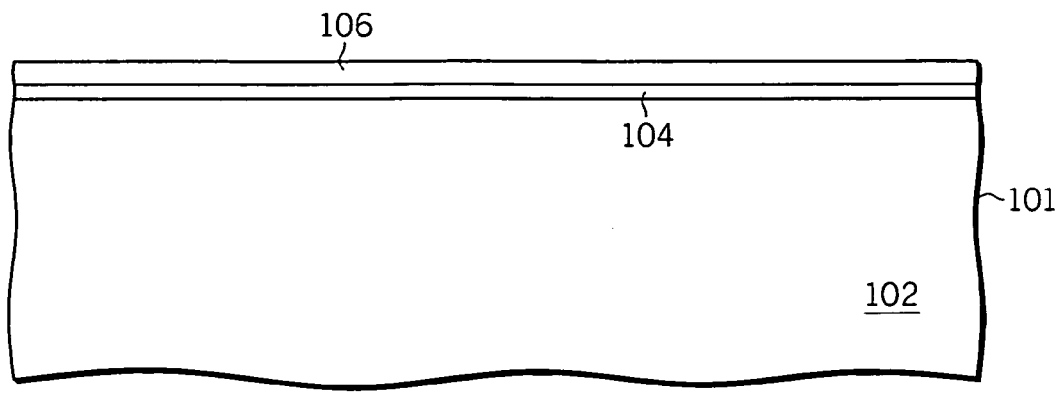
FIG. 1 is a partial cross sectional view of a wafer at an intermediate stage in a fabrication process in which a hard mask is formed on a dielectric liner over a semiconductor layer of a wafer.

Referring to the drawings, FIG. 1 through FIG. 11 depict a set of partial cross sectional views of a semiconductor wafer at various stages in one embodiment of a process for fabricating a nonvolatile storage device 100. In FIG. 1, a dielectric liner 104 and a hard mask 106 are formed on an upper surface of a semiconductor layer 102 of a semiconductor wafer 101. The semiconductor layer is preferably doped or undoped monocrystalline silicon. In other embodiments, semiconductor layer 102 may include other semiconductors such as germanium or various semiconductor alloys such as the III-V semiconductor alloys including gallium arsenide. Wafer 101 may also be a semiconductor on insulator (SOI) wafer in which semiconductor layer 102 overlies a buried oxide (BOX) layer (not depicted).

In one embodiment, dielectric liner 104 is silicon oxide, which may be thermally formed (grown) or deposited using CVD (chemical vapor deposition). Hard mask 106 is preferably a dielectric that can be selectively etched with respect to semiconductor layer 102. Hard mask 106 is preferably CVD silicon nitride, which is desirable for its ability to inhibit oxidation of an underlying semiconductor thereby providing a mask for a thermal oxidation process.

Figure 2:
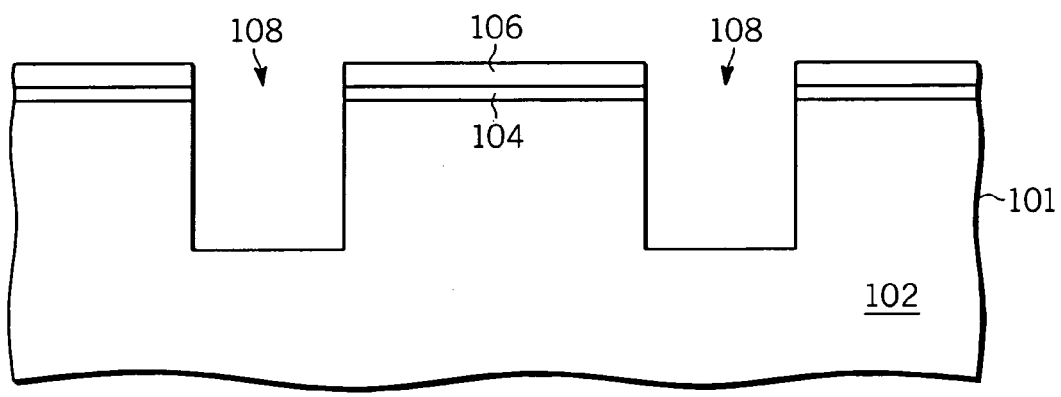
FIG. 2 depicts processing subsequent to FIG. 1 in which trenches are formed in the semiconductor layer.

Referring now to FIG. 2, trenches 108 are formed in semiconductor layer 102. Trenches 108 define the basic structure of the storage device to be formed. Formation of trenches 108 includes conventional photolithographic patterning of dielectric liner 104 and hard mask 106, followed by a dry etch process that etches the semiconductor material (e.g., silicon) preferentially with respect to liner 104 and hard mask 106. Etch processes of this type are well known in the field of semiconductor fabrication. In the depicted implementation, trenches 108 have an aspect of approximately 1:2. A depth of trenches 108 is an implementation detail, but trenches having a depth in the range of approximately 50 nm to 300 nm are desirable for applications requiring a dense storage array.

Figure 3:
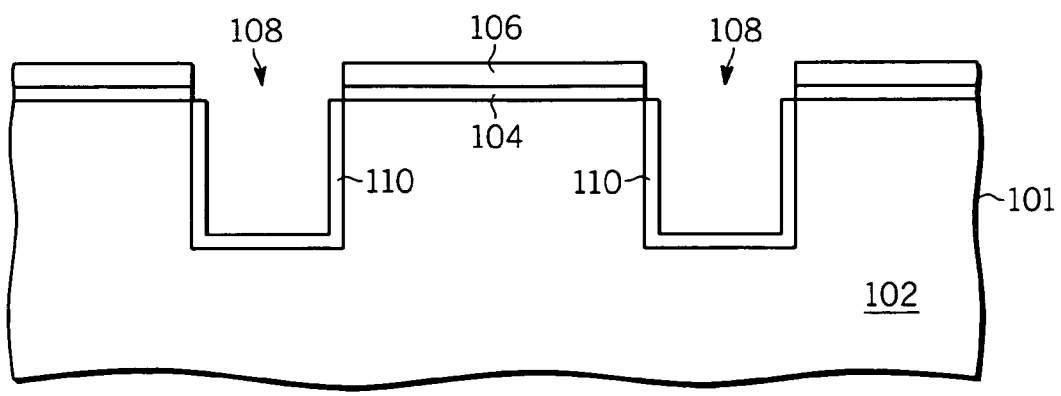
FIG. 3 depicts processing subsequent to FIG. 2 in which the trenches are lined with a sacrificial dielectric.

In FIG. 3, a dielectric, referred to herein as sacrificial dielectric 110, is formed on the sidewalls and floor of trenches 108. In some embodiments, sacrificial dielectric 110 is a deposited or thermally formed silicon oxide compound. Sacrificial dielectric 110 are used to protect the silicon substrate during a subsequent ion implantation step.

Figure 4:
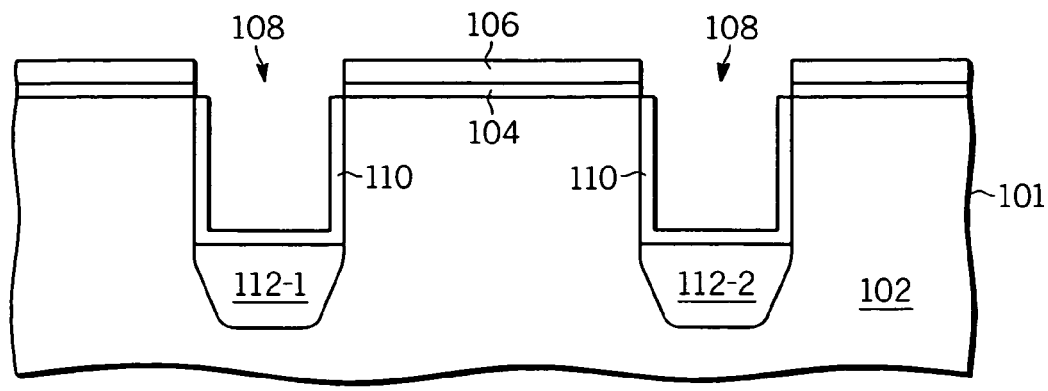
FIG. 4 depicts processing subsequent to FIG. 3 in which source/drain regions are formed underlying the trenches.

In FIG. 4, source/drain regions 112-1 and 112-2 (generically or collectively referred to as source/drain region(s) 112) are formed underlying trenches 108. Source/drain regions 112 are electrically conductive, heavily-doped regions having a conductivity type opposite to a conductivity type of semiconductor layer 102. For an embodiment employing NMOS storage devices, for example, semiconductor layer 102 is preferably a lightly doped p-type (p−) silicon and source/drain regions 112 are heavily doped n-doped (n+) silicon regions having an impurity distribution in excess of 1e18 cm$^{-3}$. In one embodiment, source/drain regions 112 are buried diffusion regions formed by implanting an n-type or p-type impurity into semiconductor layer 102 underlying trenches 108 and thereafter performing a diffusion step. In other embodiments, the ion implantation step is omitted and source/drain regions 112 are formed using diffusion processes only.

Figure 5:
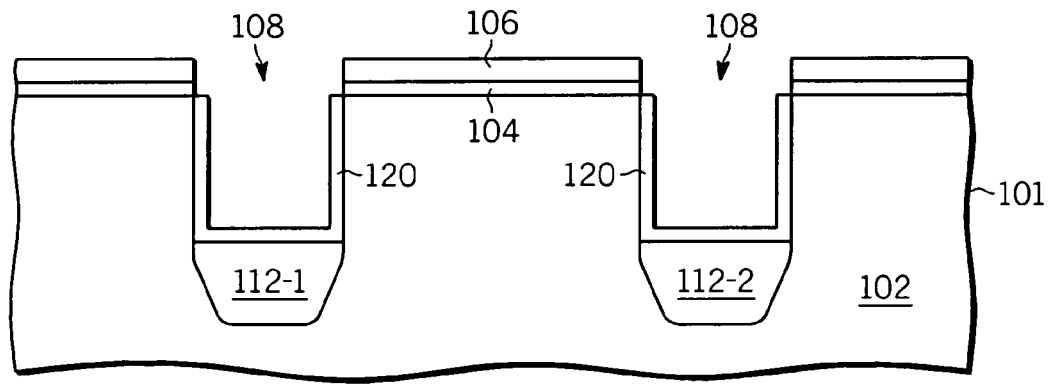
FIG. 5 depicts processing subsequent to FIG. 4 in which the bottom dielectric is removed and a gate dielectric is formed.

In FIG. 5, sacrificial dielectric 110 has been removed and a gate dielectric 120 has been formed on the sidewalls and floor of trenches 108. In some embodiments, gate dielectric 120 will serve as the gate dielectric for a select gate structure to be formed in trenches 108. Gate dielectric 120 may be a thermally formed silicon dioxide film, a high K dielectric film (a dielectric film having a dielectric constant greater than 4), or a combination thereof. In one embodiment, the equivalent oxide thickness (EOT) of gate dielectric 120 is in the range of approximately 1 to 20 nm. The EOT represents the thickness of a dielectric film divided by the ratio of the film's dielectric constant to the dielectric constant of silicon dioxide.

Figure 6:
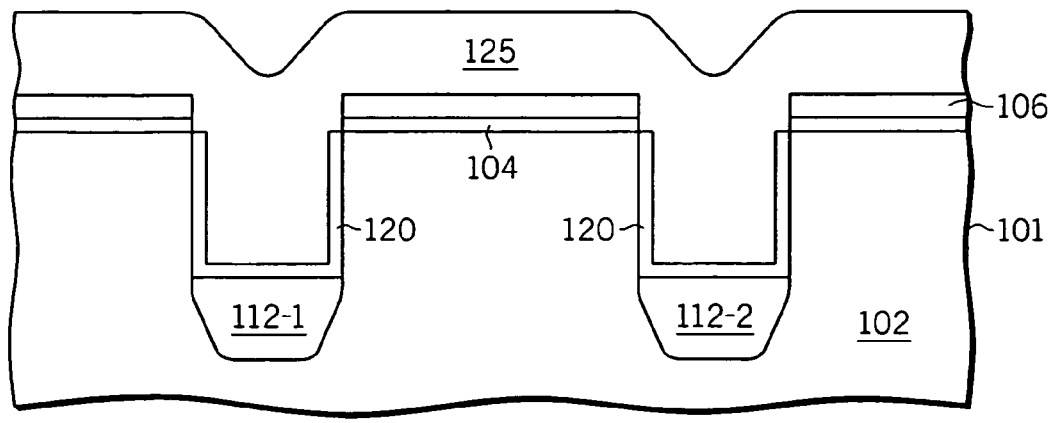
FIG. 6 depicts processing subsequent to FIG. 5 in which a select gate layer is formed.

Referring to FIG. 6, a select gate layer 125 is non-selectively or blanket deposited over wafer 101 so that select gate layer 125 fills trenches 108 and overlies hard mask 106. Select gate layer 125 is an electrically conductive material that will serve as the select gate for the subsequently formed storage cell. In one embodiment, select gate layer 125 is a conventionally formed p-type or n-type polysilicon layer. In this embodiment, select gate layer 125 may include a silicide film overlying the polysilicon. In other embodiments, select gate layer 125 is a metal material, transition metal material, or a combination thereof. In the polysilicon embodiment, a thickness of control gate layer 125 is in the range of approximately 100 to 250 nm.

Figure 7:
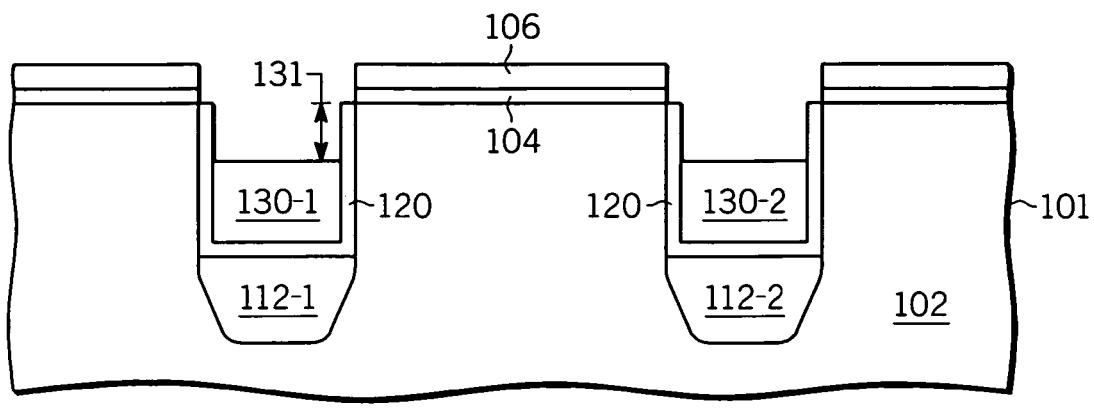
FIG. 7 depicts processing subsequent to FIG. 6 in which the select gate layer is processed to form select gates in the trenches.

Turning now to FIG. 7, portions of select gate layer 125 have been removed to form individual or distinct select gates 130-1 and 130-2, generically or collectively referred to as select gate(s) 130, within trenches 108-1 and 108-2 respectively. The process to remove portions of select gate layer 125 may include performing a chemical mechanical polish (CMP) to polish gate layer 125 back to an upper surface of hard mask 106 and then performing a dry etch to remove portions of gate layer 125 within trenches 108. In the depicted embodiment, the height of select gates 130 is less than the depth of trenches 108 so that the upper surface of select gates 125 is horizontally displaced below the upper surface of semiconductor layer 102. The minimum horizontal displacement 131 between the upper surface of select gates 130 and the upper surface of semiconductor layer 102 is preferably in the range of approximately 5 to 100 nm.

Figure 8:
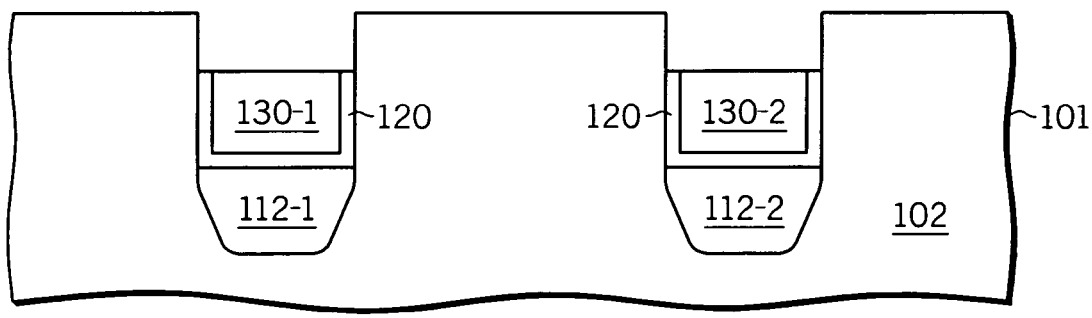
FIG. 8 depicts processing subsequent to FIG. 7 in which the hard mask and exposed portions of the gate dielectric are removed.
Figure 9:
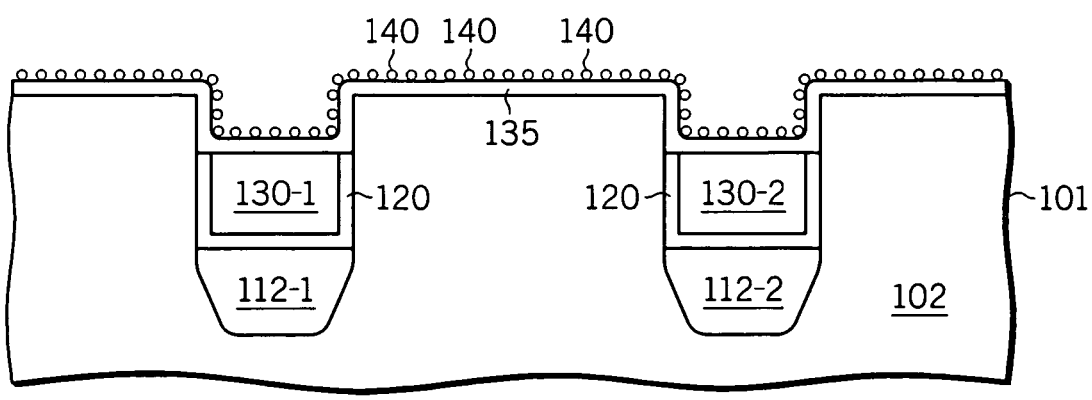
FIG. 9 depicts processing subsequent to FIG. 8 in which discontinuous storage elements are formed over a bottom dielectric.
Figure 10:
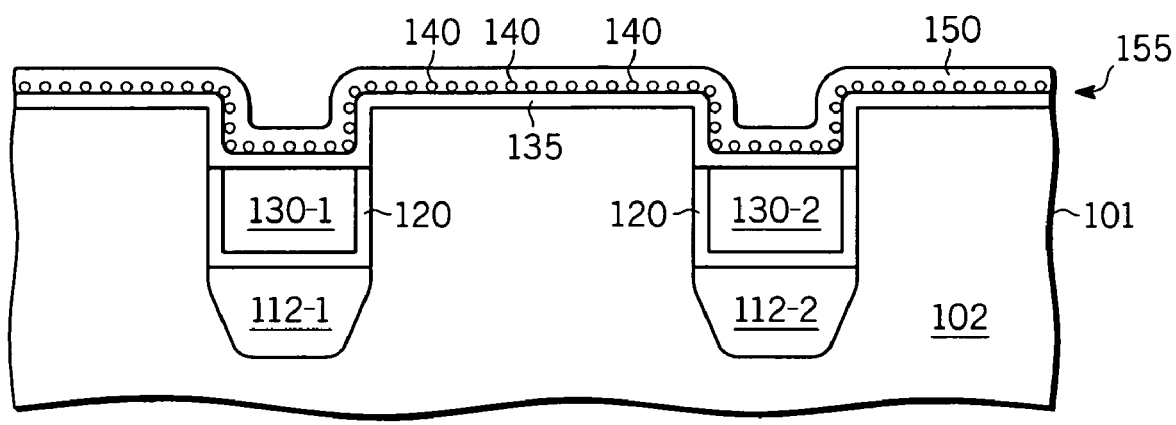
FIG. 10 depicts processing subsequent to FIG. 9 in which a top dielectric is formed on the bottom dielectric.

In FIG. 8, hard mask 106, dielectric liner 104 and exposed portions of gate dielectric 120 have been etched or otherwise removed. Removal of hard mask 106 and dielectric liner 104 exposed upper surfaces of semiconductor layer 102 while removal of the exposed portions of gate dielectric 120 exposes the portions of the sidewalls of trenches 108 located above select gates 130. This embodiment is suitable for an implementation in which a subsequently formed charge storage stack is formed non-selectively as depicted in FIG. 9 and FIG. 10 below. In other embodiments, it may be desirable to form the charge storage stack selectively or, more specifically, form the charge storage stack only within trenches 108. In this selective charge storage stack embodiment, removal of hard mask 106 may be deferred until after the charge storage stack is formed.

FIG. 9 and FIG. 10 depict the formation of a charge storage stack 155 that makes the cell capable of non-volatile storage is performed. In the depicted embodiment, charge storage stack 155 includes discontinuous storage elements (DSEs) formed in a dielectric layer. In one such embodiment, a bottom dielectric layer is formed, DSEs are deposited on the bottom dielectric, and a top dielectric is formed overlying the bottom dielectric and containing the DSEs. Other embodiments may use conventional floating gates or physically contiguous non-conductive storage elements such as silicon nitride.

Turning now to FIG. 9, a bottom dielectric 135 is formed overlying exposed portions of semiconductor layer 102 and overlying the upper surface of select gates 130. In the preferred embodiment, bottom dielectric 135 is a thin, high quality dielectric. A thin dielectric is required to achieve adequate programming and erasing times using either injection-based or tunneling-based programming techniques. A high quality dielectric is required to withstand the potentially large programming and erasing voltages and currents and the potentially large number of programming and erasing cycles without exhibiting breakdown or significant leakage. In the preferred embodiment, bottom dielectric 135 is a thermally formed silicon dioxide film having a thickness in the range of approximately 4 to 10 nm.

Following formation of bottom dielectric 135, a layer of DSEs are formed overlying bottom dielectric 135. In the depicted embodiment, DSEs 140 (sometimes referred to as nanocrystals) are a set of discreet accumulations of a material capable of storing a charge. Suitable materials include silicon, polysilicon, other semiconductors, metals such as titanium, tungsten, tantalum, aluminum, copper, platinum, and the like, and dielectrics such as silicon nitride or silicon oxynitride. In the preferred implementation, DSEs 140 are silicon DSEs (silicon nanocrystals). In this implementation, DSEs 140 may be formed in any one of a variety of ways, preferably without requiring any photolithography steps. One DSE formation technique includes depositing an amorphous silicon layer and heating it to form the nanocrystals. Another technique is to deposit the nanocrystals using chemical vapor deposition (CVD). DSEs 140 may have various shapes, including hemispherical and spherical, depending upon the deposition technique employed. In one implementation, DSEs 140 are approximately 5 nm in diameter and are spaced at a predominantly uniform spacing of approximately 5 nm. Regardless of the formation technique used, each DSE 140 is a particle of silicon that is electrically and physically isolated from its neighbors.

Referring now to FIG. 10, a top dielectric 150 has been non-selectively formed overlying DSEs 140 to complete the formation of charge storage stack 155, which includes bottom dielectric 135, DSEs 140, and top dielectric 150. In the preferred embodiment, top dielectric 150 is a high temperature oxide (HTO) desirable because it exhibits characteristics (e.g., density and dielectric strength) substantially equivalent to thermally formed silicon dioxide. In this embodiment, the HTO may be formed by a conventional HTO process such as reacting dichlorosilane and nitrous oxide at temperatures approaching 900 C. In other embodiments, it may be desirable to employ a lower temperature process (e.g., a TEOS (tetraethylorthosilicate) process) to guard against unintended oxidation of the silicon embodiments of DSEs 140. Top dielectric 150 may also be composed of other dielectrics such as aluminum oxide, hafnium oxide, or other dielectrics with a high dielectric constant. Top dielectric layer 150 may be composed of multiple layers of differing dielectric materials. A thickness of top dielectric 150 is preferably in the range of approximately 5 to 15 nm.

Figure 11:
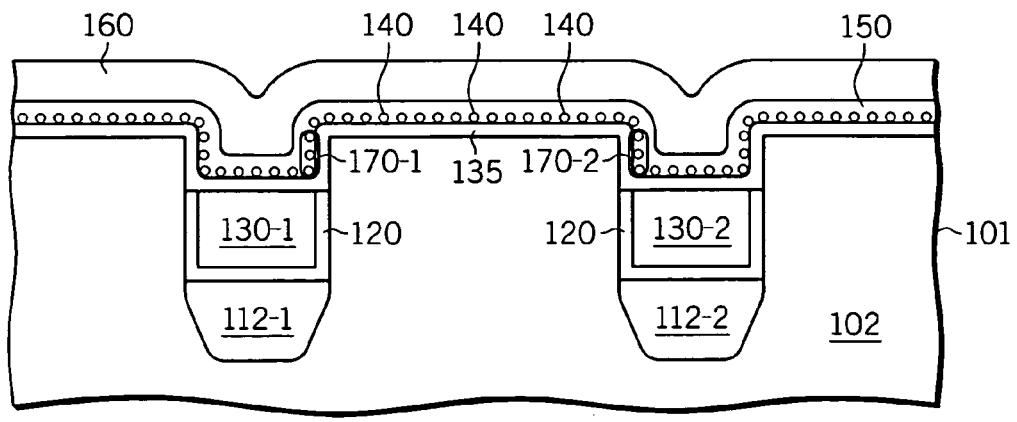
FIG. 11 depicts processing subsequent to FIG. 10 in which a control gate layer is formed overlying the top dielectric to form a storage cell.

Turning now to FIG. 11, a control gate 160 is deposited overlying charge storage stack 155. Control gate 160 is an electrically conductive material such as heavily doped polysilicon, aluminum, copper, transition metals, silicides, or a combination thereof. An embodiment employing a polysilicon control gate 160 has a thickness in the range of approximately 9 to 200 nm. Various configurations of control gates are disclosed herein. In the embodiment depicted in the cross section of FIG. 11 and the top view of FIG. 13, control gate 160 is a continuous structure that spans a memory array of which the described structures are most likely a part. Control gate 160 is oriented perpendicular to the select gates 130 and the source/drain regions 112 in this embodiment.

Figure 13:
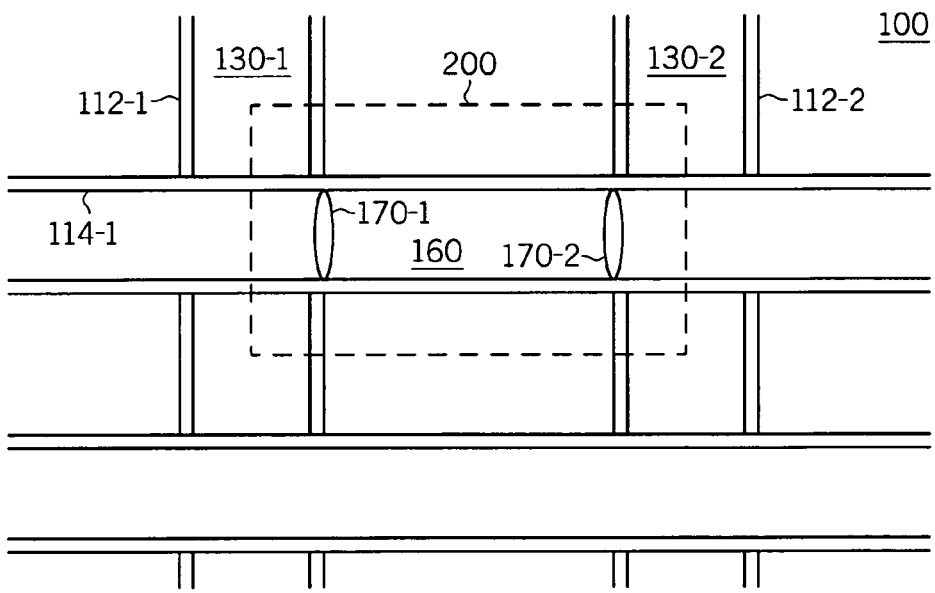
FIG. 13 is a top view of the storage cell of FIG. 11.
Figure 12:
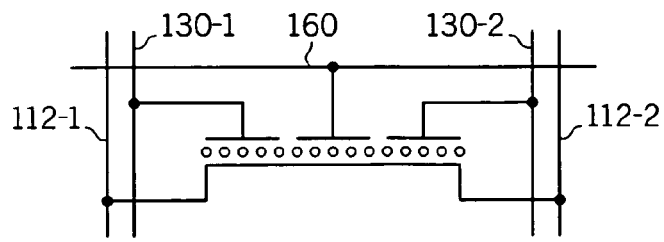
FIG. 12 is a schematic representation of FIG. 11.

A top view of storage device 100 depicted in FIG. 13 emphasizes storage device 100 as part of an array 201 of storage cells 200. In the depicted embodiment, storage cell 200 encompasses a single storage device 100, which includes a pair of parallel source/drain regions 112 underlying trenches 108 (see FIG. 11) formed in semiconductor layer 102. A gate dielectric 120 is present adjacent the sidewalls of trench 108. Each select gate 130 runs perpendicular to the plane of cross section, overlying a corresponding source/drain region 112. Contacts to source/drain regions 112, select gates 130 and control gate 160 are preferably made outside of the array 201. The injection regions 170-1 and 170-2 shown in FIG. 11 are seen in FIG. 13 positioned at the edge of source/drain regions 112.

Storage device 100 includes a pair of injection regions 170-1 and 170-2 programmable using source side injection (SSI) programming. Programming table 190 of FIG. 18 indicates biasing conditions for programming SSI injection regions 170-1 and 170-2. The programming conditions listed are for NMOS embodiments of storage device 100. Opposite polarities apply for PMOS embodiments.

Programming a first bit that is associated with SSI injection 170-1 includes biasing source/drain region 112-1 to a first programming voltage ($V_{P1}$), biasing control gate 160 to a second programming voltage ($V_{P2}$), biasing first and select gates 130-1 and 130-2 to a third programming voltage ($V_{P3}$), biasing source/drain region 112-2 and semiconductor layer 102 to a fourth programming voltage ($V_{P4}$). For one NMOS embodiment of storage cell 100, $V_{P1}$ (source/drain programming voltage), $V_{P2}$, control gate programming voltage, and $V_{P3}$ (select gate programming) are all in the range of approximately 5 V to 9 V while $V_{P4}$ is 0 V (ground).

Exemplary programming values are depicted in FIG. 18. These biasing conditions are preferably applied to storage device 100 for a specified duration, which is preferably on the order of microseconds. Ballistic SSI injection region 170-2 is programmed by biasing source/drain region 112-2 to $V_{P1}$, control gate 160 to $V_{P2}$, select gates 130-1 and 130-2 to $V_{P3}$, and source/drain region 112-1 and semiconductor layer 102 to $V_{P4}$.

Erasing the programmed injecting region includes biasing the control gate to a first erase voltage ($V_{E1}$) and biasing the semiconductor layer to a second erase voltage ($V_{E2}$). The select gates 130 may be biased to $V_{E1}$ or some other voltage during erase to insure complete erase. In addition, erase can be accomplished in either polarity. Thus, for example, $V_{E1}$ can be +/−6V, while $V_{E2}$ is −/+6V. The erase conditions apply to each of the programming tables.

Figure 14:
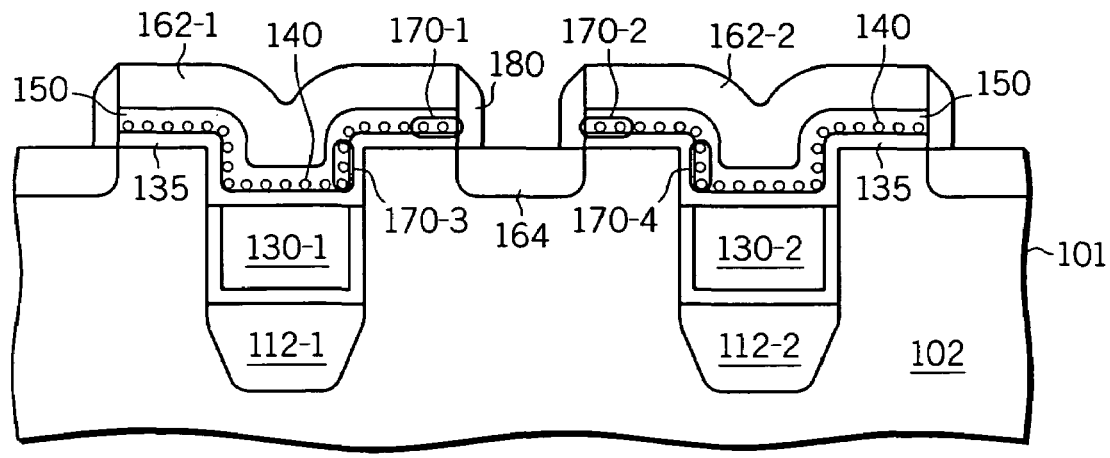
FIG. 14 depicts an alternative implementation employing a discontinuous control gate.
Figure 15:
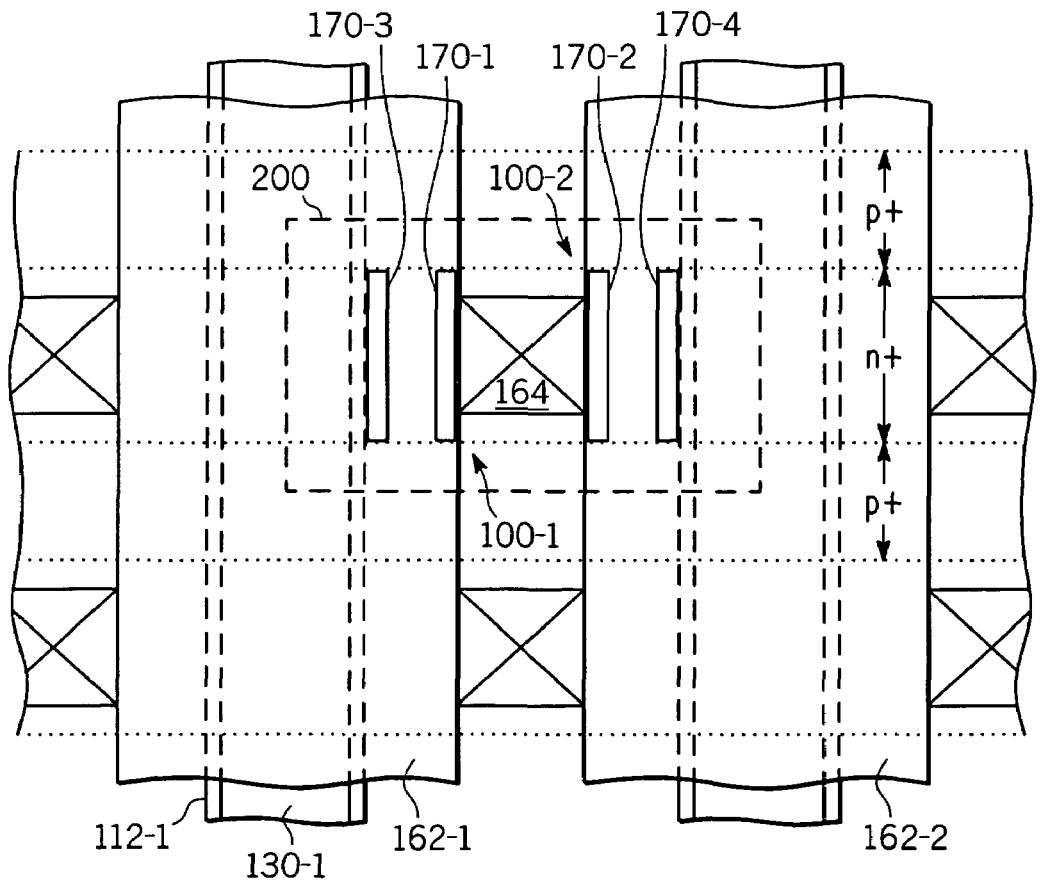
FIG. 15 is a top view of an array of storage cells comprised of the storage device of FIG. 14.

A second embodiment of a storage cell 200 is depicted in the cross section of FIG. 14 and the top view of FIG. 15. This embodiment includes a contact to a diffusion region 164 formed between adjacent trenches 108. In this embodiment, control gates 162-1, 162-2, through 162-n run parallel to select gates 130 and source/drain regions 112 rather than perpendicular to select gates 130 as in the embodiment of FIG. 11. In this configuration, storage cell 200 includes two storage devices 100-1 and 100-2, each of which may program two injection regions to store two bits of information (four unique states). Diffusion region 164 is of the same conductivity type as source/drain regions 112 (e.g., n-type for NMOS embodiments) and may serve as a source/drain for either device. Isolation between adjacent diffusion regions 164 is provided by "striped" regions of p-type substrate (for implementations in which diffusion regions 164 are n-type). A striped mask is used to a implant a first type of dopant (e.g. n-type) into diffusion regions 164 (which are also masked in the array such that they are self-aligned to control gates 160) and a second type of dopant (e.g., p-type) in the rows between diffusion regions 164. In this manner, neighboring diffusion regions 164 are isolated from one another from row to row by a region of opposite doping polarity of suitable concentration to prevent inversion between neighboring rows during the program or read operations. First storage device 100-1 includes control gate 162-1, source/drain region 112-1, select gate 130-1, and diffusion region 164. Second storage device 100-2 includes control gate 162-2, source/drain regions 112-2, select gate 130-2, and diffusion region 164.

Programming table 191 of FIG. 19 indicates the biasing required to program the SSI injection regions 170-3 and 170-4 for the embodiment of storage cell 200 depicted in FIG. 14 and FIG. 15. Programming SSI injection region 170-3 of storage device 100-1 includes biasing source/drain region 112-1 to $V_{P1}$, control gate 162-1 to $V_{P2}$, select gate 130-1 to $V_{P3}$, and diffusion region 164 and semiconductor layer 102 to $V_{P4}$. Programming ballistic SSI injection region 1704 of storage device 100-2 is achieved by biasing source/drain region 112-2 to $V_{P1}$, control gate 162-2 to $V_{P2}$, select gate 130-2 to $V_{P3}$, and diffusion region 164 and semiconductor layer 102 to $V_{P4}$.

Programming table 192 of FIG. 20 indicates the biasing conditions for programming the HCI injection regions 170-1 and 170-2 of storage cell 200 as shown in FIG. 14 and FIG. 15. HCI injection region 170-3 of storage device 100-1 is programmed by biasing source/drain region 112-1 to $V_{P5}$, control gate 162-1 to $V_{P6}$, select gate 130-1 to $V_{P7}$, and diffusion region 164 and semiconductor layer 102 to $V_{P4}$. HCI injection region 170-2 of storage device 100-2 is programmed by biasing source/drain region 112-2 to $V_{P5}$, control gate 162-2 to $V_{P6}$, select gate 130-2 to $V_{P7}$, and diffusion region 164 and semiconductor layer 102 to $V_{P7}$.

Figure 16:
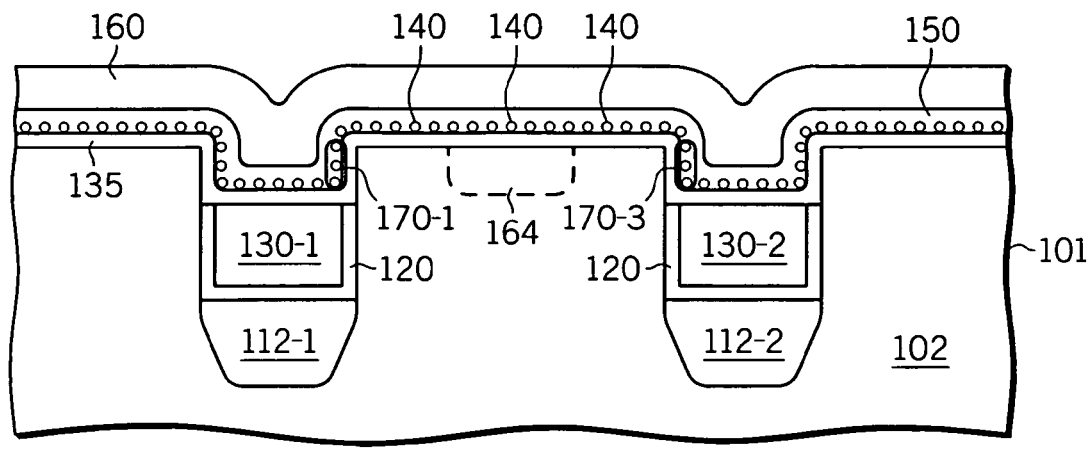
FIG. 16 is sectional view 1 taken from the view of FIG. 17 showing another alternative implementation employing a continuous control gate and diffusion regions displaced on either side of the control gate.
Figure 17:
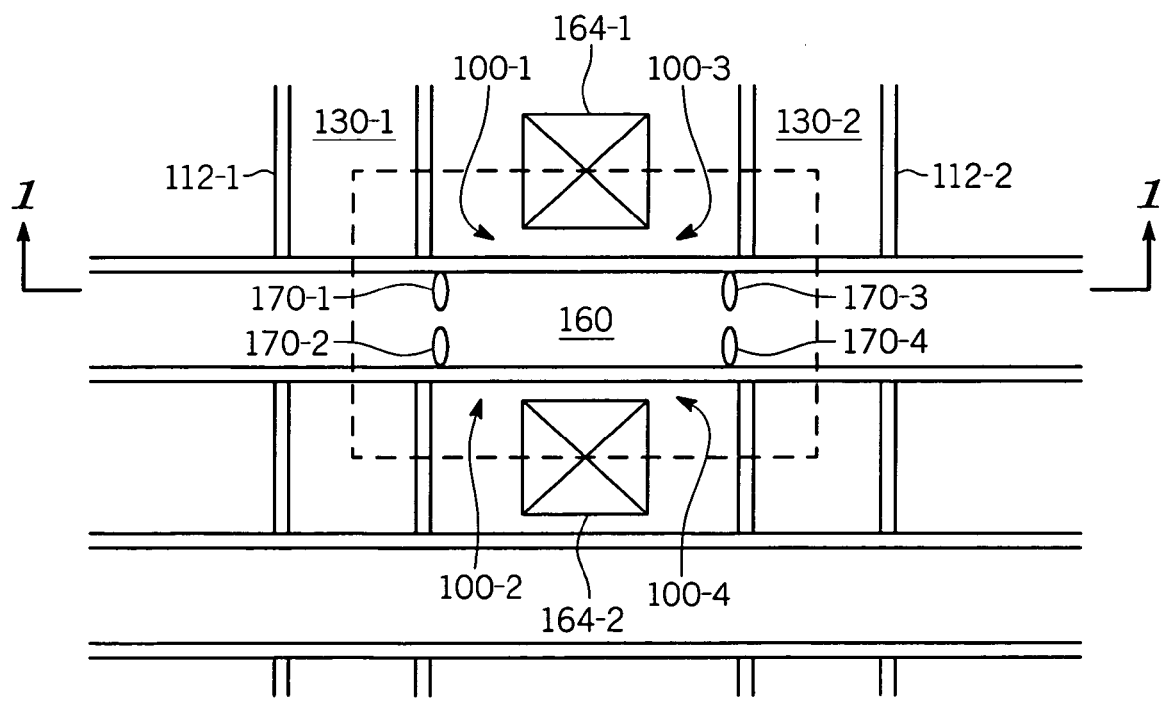
FIG. 17 is a top view of an array of storage cells comprised of the storage device of FIG. 16.

A third embodiment of storage cell 200 is depicted in the cross section of FIG. 16 and the top view of FIG. 17. In this embodiment, storage cell 200 includes a pair of diffusion regions 164-1 and 164-2 where diffusion region 164-1 is positioned on a first side of a continuous control gate 160 and diffusion region 164-2 is positioned on the other side of control gate 160. Contacts (not depicted) are made to diffusion regions 164-1 and 164-2 within semiconductor layer 102. Like diffusion region 164 in FIG. 14, the conductivity type of diffusion regions 164-1 and 164-2 is opposite the conductivity type of semiconductor layer 102 and the same conductivity type as source/drain regions 112-1 and 112-2.

This embodiment of storage cell 200 includes four storage devices 100-1 through 100-4. Storage device 100-1 includes control gate 160, select gate 130-1, source/drain region 112-1, and diffusion region 164-1. Storage device 100-2 includes control gate 160, select gate 130-1, source/drain region 112-1, and diffusion region 164-2. Storage device 100-3 includes control gate 160, select gate 130-2, source/drain region 112-2, and diffusion region 164-1. Storage device 100-4 includes control gate 160, select gate 130-2, source/drain region 112-2, and diffusion region 164-2.

In the depicted embodiment desirable for its symmetrical design, diffusion regions 164-1 and 164-2 are arranged in a straight line fashion with both contacts being equidistant from source/drain regions 112-1 and 112-2. In another embodiment of storage cell 200, diffusion regions 164-1 and 164-2 are arranged in a diagonal configuration with diffusion region 164-1 being closer to source/drain region 112-1 and diffusion 164-2 being closer to source/drain region 112-2. This embodiment simplifies the design of back end metalization (not depicted) that will connect to the contact structures.

Each storage device 100-1 through 1004 has a corresponding SSI injection region 170-1 through 1704. By including contacts on opposing sides of control gate 160, this third embodiment is able to program two SSI injection regions within a single charge storage stack 155.

Programming table 193 of FIG. 21 indicates programming conditions for the SSI injection regions 170-1, 170-2, 170-3, and 170-4 for the embodiment of storage cell 200 depicted in FIG. 16 and FIG. 17. Programming SSI injection region 170-1 of storage device 100-1 includes biasing source/drain region 112-1 to $V_{P1}$, control gate 160 to $V_{P2}$, select gate 130-1 to $V_{P3}$, and diffusion region 164-1 and semiconductor layer 102 to $V_{P4}$ while select gate 130-2, source/drain region 112-2, and diffusion region 164-2 are left floating (indicated by an X in table 193). Programming SSI injection region 170-2 of storage device 100-2 includes biasing source/drain region 112-2 to $V_{P1}$, control gate 160 to $V_{P2}$, select gate 130-1 to $V_{P3}$, diffusion region 164-2 and semiconductor layer 102 to $V_{P4}$, and floating select gate 130-2, source/drain region 112-2, and diffusion region 164-1. SSI injection region 170-3 of storage device 100-3 is programmed by biasing source/drain region 112-1 to $V_{P1}$, control gate 160 to $V_{P2}$, select gate 130-2 to $V_{P3}$, diffusion region 164-1 and semiconductor layer 102 to $V_{P4}$, and floating select gate 130-1, source/drain region 112-1, and diffusion region 164-2. SSI injection region 170-4 of storage device 100-4 is programmed by biasing source/drain region 112-2 to $V_{P1}$, control gate 160 to $V_{P2}$, select gate 130-2 to $V_{P3}$, diffusion region 164-2 and semiconductor layer 102 to $V_{P4}$, and floating select gate 130-1, source/drain region 112-1, and diffusion region 164-1.

In the foregoing specification, the invention has been described with reference to specific embodiments. However, one of ordinary skill in the art appreciates that various modifications and changes can be made without departing from the scope of the present invention as set forth in the claims below. For example, although the depicted embodiment is an NMOS transistor embodiment, PMOS embodiments are equally encompassed. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method of fabricating a storage device in an array of storage cells, comprising:
    forming first and second trenches in a semiconductor layer, wherein the first and second trenches are immediately adjacent trenches;
    forming first and second source/drain regions underlying the first and second trenches, respectively;
    forming first and second select gates in the first and second trenches, respectively;
    forming a charge storage stack overlying the first and second select gates, wherein the charge storage stack includes a layer of discontinuous storage elements (DSEs), wherein, within a storage cell, a plurality of DSEs lies within at least one of the first and second trenches and over a first portion of the semiconductor layer between the first and second trenches;
    forming a control gate overlying the charge storage layer; and forming third source/drain regions that are spaced apart from each other and lie within second portions of the semiconductor layer between the first and second trenches.

2. The method of claim 1, wherein the DSEs comprise discrete accumulations of polysilicon.

3. The method of claim 1, further comprising lining the first and second trenches with a select gate dielectric prior to forming the first and second select gates.

4. The method of claim 3, wherein forming the first and second select gates comprises forming the first and second select gates wherein an upper surface of the first and second select gates is vertically displaced below an upper surface of the first and second trenches.

5. The method of claim 1, wherein forming the first and second select gates comprises forming the first and second select gates wherein an upper surface of the first and second select gates is vertically displaced below an upper surface of the first and second trenches.

6. The method of claim 5, wherein forming the control gate comprises forming a continuous control gate traversing the first and second trenches perpendicular to the first and second select gates.

7. The method of claim 5, wherein forming the control gate comprises forming a fist control gate overlying the first select gate and a second control gate overlying the second select gate.

8. The method of claim 1, wherein forming the control gate comprises forming a continuous control gate traversing the first and second trenches perpendicular to the first and second select gates.

9. The method of claim 8, further comprising forming first and second contacts to a semiconductor layer between the first and second trenches, wherein the first and second contacts are positioned on either side of the control gate between the first and second select gates.

10. The method of claim 9, wherein the DSEs comprise discrete accumulations of polysilicon.

11. The method of claim 9, further comprising lining the first and second trenches with a select gate dielectric prior to forming the first and second select gates.

12. The method of claim 9, wherein forming the first and second select gates comprises forming the first and second select gates wherein an upper surface of the first and second select gates is vertically displaced below an upper surface of the first and second trenches.

13. The method of claim 8, wherein forming the control gate comprises forming a first control gate overlying the first select gate and a second control gate overlying the second select gate.

14. The method of claim 1, wherein forming the control gate comprises forming a first control gate overlying the first select gate and a second control gate overlying the second select gate.

15. The method of claim 14, wherein lengths of the first and second control gates and lengths of the first and second select gates are parallel to one another.

16. The method of claim 14, wherein within a particular storage cell, the DSEs include a first injection region within the first trench and a second injection region within the second trench.

17. The method of claim 1, wherein each storage cell is configured to store more than one bit of datum.

18. The method of claim 1, wherein forming the third source/drain regions comprises forming the third source/drain regions spaced apart from walls of the first and second trenches.

19. The method of claim 1, wherein forming the third source/drain regions is performed after forming the control gate.

20. The method of claim 1, wherein within a particular storage cell, the DSEs include a first injection region within the first trench and a second injection region overlying the first portion of the semiconductor layer.

* * * * *

UNITED STATES PATENT AND TRADEMARK OFFICE
CERTIFICATE OF CORRECTION

| | |
|---|---|
| PATENT NO. | : 7,592,224 B2 |
| APPLICATION NO. | : 11/393287 |
| DATED | : September 22, 2009 |
| INVENTOR(S) | : Craig T. Swift, Gowrishankar L. Chindalore and Paul A. Ingersoll |

Page 1 of 1

It is certified that error appears in the above-identified patent and that said Letters Patent is hereby corrected as shown below:

Title page, item (54), Please change "DECONTINUOUS" to --DISCONTINUOUS--.

Column 1, Line 2, Please change "DECONTINUOUS" to --DISCONTINUOUS--.

Signed and Sealed this

First Day of June, 2010

David J. Kappos
*Director of the United States Patent and Trademark Office*